United States Patent
Zhang et al.

(10) Patent No.: US 10,083,873 B1
(45) Date of Patent: Sep. 25, 2018

(54) SEMICONDUCTOR STRUCTURE WITH UNIFORM GATE HEIGHTS

(71) Applicant: GLOBALFOUNDRIES INC., Grand Cayman (KY)

(72) Inventors: Xing Zhang, Clifton Park, NY (US); Xinyuan Dou, Clifton Park, NY (US); Hong Yu, Rexford, NY (US); Zhenyu Hu, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/613,981

(22) Filed: Jun. 5, 2017

(51) Int. Cl.
*H01L 27/088* (2006.01)
*H01L 21/8234* (2006.01)
*H01L 29/10* (2006.01)

(52) U.S. Cl.
CPC ........... *H01L 21/823431* (2013.01); *H01L 21/823437* (2013.01); *H01L 21/823481* (2013.01); *H01L 27/0886* (2013.01); *H01L 29/1033* (2013.01)

(58) Field of Classification Search
CPC .............. H01L 27/0886; H01L 29/1033
USPC .................................................. 257/330, 334
See application file for complete search history.

(56) References Cited

U.S. PATENT DOCUMENTS

| | | | |
|---|---|---|---|
| 8,298,895 B1* | 10/2012 | Alptekin | H01L 29/66492 438/276 |
| 8,659,097 B2 | 2/2014 | Mor et al. | |
| 8,673,709 B2 | 3/2014 | Lee et al. | |
| 8,748,993 B2 | 6/2014 | Lee et al. | |
| 8,941,153 B2 | 1/2015 | Lee et al. | |
| 2008/0128797 A1* | 6/2008 | Dyer | H01L 29/66795 257/328 |
| 2009/0057780 A1* | 3/2009 | Wong | H01L 21/845 257/401 |
| 2009/0209074 A1* | 8/2009 | Anderson | H01L 29/66795 438/283 |
| 2011/0133292 A1 | 6/2011 | Lee et al. | |
| 2011/0147848 A1* | 6/2011 | Kuhn | H01L 21/76229 257/368 |
| 2013/0069167 A1* | 3/2013 | Zhu | H01L 27/1104 257/369 |
| 2013/0082333 A1* | 4/2013 | Chen | H01L 21/823431 257/401 |
| 2013/0221443 A1* | 8/2013 | Lin | H01L 27/0924 257/368 |
| 2014/0077296 A1* | 3/2014 | Yamashita | H01L 21/823431 257/347 |
| 2014/0106528 A1* | 4/2014 | Quyang | H01L 21/8234 438/275 |
| 2014/0210001 A1* | 7/2014 | Yamazaki | H01L 21/22 257/330 |
| 2014/0264483 A1* | 9/2014 | Yoshida | H01L 21/28079 257/288 |
| 2014/0284723 A1 | 9/2014 | Lee et al. | |

(Continued)

*Primary Examiner* — George Fourson, III
(74) *Attorney, Agent, or Firm* — Francois Pagette; Andrew M. Calderon; Roberts Mlotkowski Safran Cole & Calderon, P.C.

(57) ABSTRACT

The present disclosure relates to semiconductor structures and, more particularly, to semiconductor structures with uniform gate heights and methods of manufacture. The structure includes: short channel devices in a first area of an integrated circuit die; and long channel devices in a second area of the integrated circuit die. The long channel devices have a same gate height as the short channel devices.

10 Claims, 4 Drawing Sheets

(56) References Cited

U.S. PATENT DOCUMENTS

| | | | |
|---|---|---|---|
| 2014/0306317 A1* | 10/2014 | Licausi | H01L 21/30625 257/506 |
| 2015/0171217 A1* | 6/2015 | Kim | H01L 29/66795 257/401 |
| 2017/0098582 A1* | 4/2017 | Yin | H01L 21/823481 |
| 2017/0179163 A1* | 6/2017 | Cheng | H01L 27/1211 |
| 2018/0006025 A1* | 1/2018 | Hook | H01L 27/088 |

* cited by examiner

SEMICONDUCTOR STRUCTURE WITH UNIFORM GATE HEIGHTS

FIELD OF THE INVENTION

The present disclosure relates to semiconductor structures and, more particularly, to semiconductor structures with uniform gate heights and methods of manufacture.

BACKGROUND

In both planar and FinFET technologies, different gate lengths are commonly used on a single die to serve multiple electrical purposes. For example, it is common to integrate both a short channel device and a long channel device on a same die. The short channel device, e.g., is typically a high performance device such as a logic device, memory device, ring oscillators, etc. From device perspective, short gate height is also preferred for increased device performance, e.g., increased performance of a ring oscillator (RO) (e.g., around 1 nm to 1% RO).

In such integration schemes, the long channel devices typically have a higher density concentration on the die than the short channel devices. For example, the power mask which defines the high power gate with thick dielectric layer and input/output areas are usually built with large gate length, e.g., Lg in high density areas. And, polishing tungsten or other gate metals, e.g., chemical mechanical polishing (CMP), during gate fabrication processes, tends to remove more material at the high gate density area than the lower density gate area due to loading effects. This, in turn, raises the risk of fin exposure for gates in high density areas, e.g., long channel devices. Accordingly, due to the fin exposure issue, it becomes ever more difficult to lower the gate height of short channel devices, without degrading device performance of the long channel devices.

SUMMARY

In an aspect of the disclosure, a structure comprises: short channel devices in a first area of an integrated circuit die; and long channel devices in a second area of the integrated circuit die. The long channel devices have a same gate height as the short channel devices.

In an aspect of the disclosure, a structure comprises: short channel finFET devices in a first area of an integrated circuit die; and long channel finFET devices in a second area of the integrated circuit die. The gate structures of the long channel devices having a same gate height as gate structures of the short channel devices, and fin structures of the short channel finFET devices and the long channel finFET devices are at a same height as measured from a surface of an isolation region.

In an aspect of the disclosure, a method comprises: forming a plurality of fin structures for short channel devices and long channel devices; forming isolation regions between the plurality of fin structures; recessing selected fin structures of the plurality of fin structures for the long channel devices, while protecting other fin structure for the short channel devices; and forming gate structures on the plurality of fin structures for the short channel devices and the long channel devices.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to semiconductor structures with uniform gate heights and methods of manufacture. More specifically, the present disclosure provides uniform gate heights for both short channel devices and long channel devices on a single die, regardless of density concentration of such devices on the integrated die. Accordingly and advantageously, by implementing the fabrication processes of the present disclosure it is now possible to obtain uniform gate height, i.e., a same gate height and final fin height in both short channel devices and long channel devices, even after gate metal polishing (CMP), e.g., tungsten. In addition, by implementing such processes described herein, an additional reduction in the gate height of short channel devices can be achieved for improved performance, e.g., RO performance, without degrading device performance of the long channel devices caused by fin exposure issues.

In fabrication processes according to embodiments described herein, a mask layer is added before fin reveal to differentiate an absolute fin height and STI height between the long channel device and the short channel device. By inserting this mask layer, uniform gate height across different gate lengths after gate polishing, e.g., tungsten, can be achieved, e.g., same gate height and same final fin height in both long channel device and short channel device. This, in turn, allows the gate height of short channel devices to be reduced, without exposing fin structures of long channel devices.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
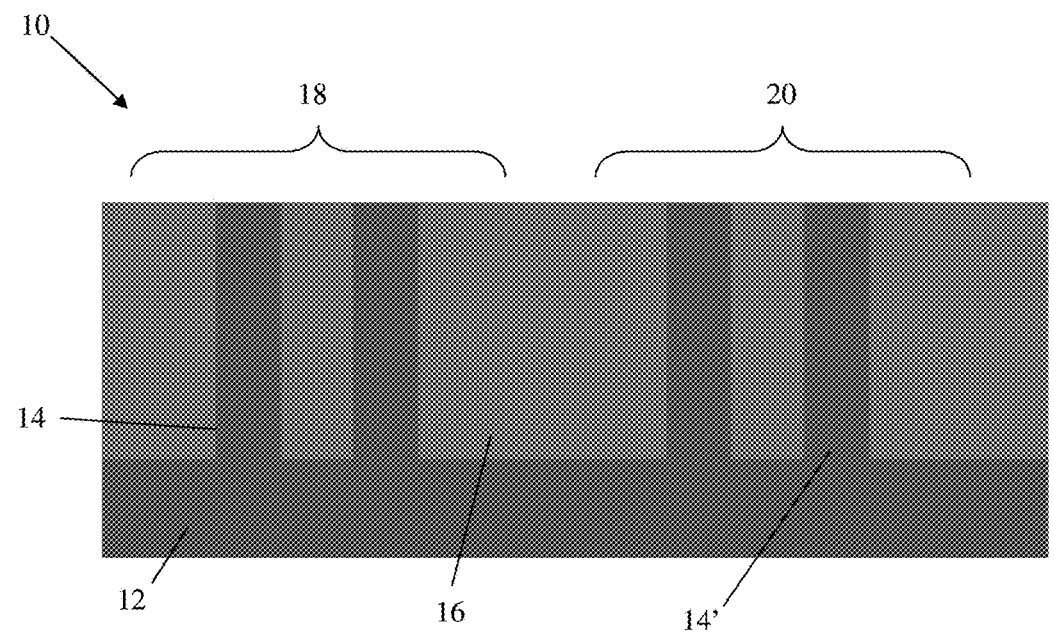
FIG. 1 shows an incoming structure and respective fabrication processes in accordance with aspects of the present disclosure.

FIG. 1 shows an incoming structure and respective fabrication processes in accordance with aspects of the present disclosure. More specifically, the structure 10 includes a substrate 12 which can be composed of semiconductor material. The substrate 12 may be composed of any suitable material including, but not limited to, Si, SiGe, SiGeC, SiC, GaAs, InAs, InP, and other III/V or II/VI compound semiconductors. A plurality of fin structures 14, 14' are formed from the substrate 12, with isolation regions 16 (e.g., shallow trench isolation (STI) structures) between the fin structures 14, 14'. The isolation regions 16 can be formed by any conventional oxide deposition processes, e.g., chemical vapor deposition (CVD), followed by a CMP process. In embodiments, the plurality of fin structures 14 can be implemented in areas of short channel devices 18 (e.g., Lg of less than 80 nm) and areas of long channel devices 20 (e.g., Lg of 80 nm and greater).

In embodiments, the plurality of fin structures 14, 14' can be formed from the substrate 12 using conventional lithography and etching techniques or, alternatively, a sidewall image technique (SIT). In an example of a SIT technique, a mandrel material, e.g., $SiO_2$, is deposited on the substrate 12 using conventional CVD processes. A resist is formed on the mandrel material, and exposed to light to form a pattern (openings). A reactive ion etching is performed through the openings to form the mandrels. Spacers are formed on the sidewalls of the mandrels which are preferably material that is different than the mandrels, and which are formed using conventional deposition processes known to those of skill in the art. The spacers can have a width which matches the dimensions of the fin structures 14, for example. The mandrels are removed or stripped using a conventional etching process, selective to the mandrel material. An etching is then performed within the spacing of the spacers to form the sub-lithographic features. The sidewall spacers can then be stripped.

Figure 2:
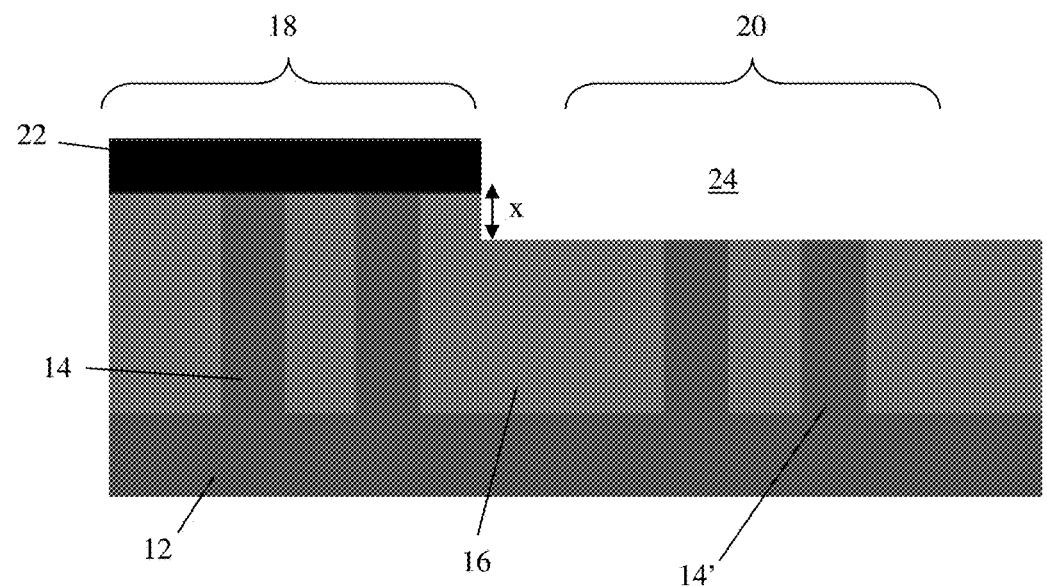
FIG. 2 shows recessed fin structures, amongst other features, and respective fabrication processes in accordance with aspects of the present disclosure.

In FIG. 2, a mask 22 is formed over the plurality of fin structures 14 and isolation regions 16 in the area of the short channel devices 18. The mask 22 (e.g., resist) formed over the plurality of fin structures 14 is exposed to energy (light) to form a pattern (opening). A non-selective etching process, e.g., reactive ion etching (RIE) with chemistry corrosive to both the material of the fin structures 14' and isolation regions 16, will then be used to form a recess 24 of depth "x" in the area of the long channel devices 20. In this way, the absolute height of the fin structures 14' are now reduced in height compared to the fin structures 14 (as measured from a surface of the substrate 12). In embodiments, the recess is about 6 nm in depth; although other depths (and, hence, reduction in height of the fin structures 14) are also contemplated herein.

Figure 3:
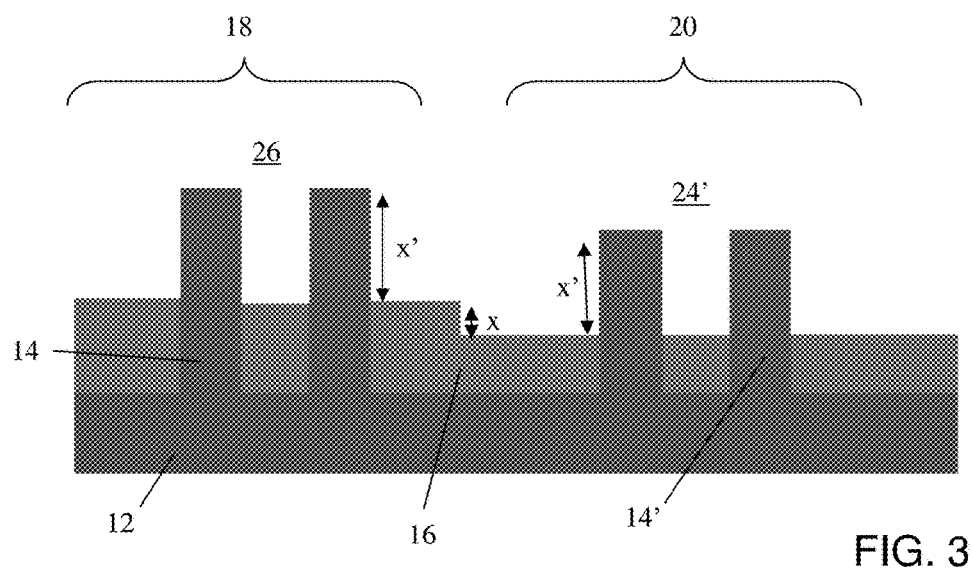
FIG. 3 shows revealed fin structures of a same height, amongst other features, and respective fabrication processes in accordance with aspects of the present disclosure.

As shown in FIG. 3, the resist is removed by a conventional oxygen ashing process or other known stripants. Following the resist removal, the fin structures 14, 14' can be revealed using a selective etch chemistry to the oxide material, e.g., isolation regions 16. As shown in FIG. 3, the recess depth "x", e.g., about 6 nm, remains intact during this fin reveal process. In this process, as the recess depth remains intact, the reveal of the fin structures 14, 14' above the isolation regions are equal, e.g., a height of "x". In more specific embodiments, the height, x', is about 41.5 nm; although other heights are also contemplated herein. It is noted, though, that the absolute height of the fin structures 14,14', though, are different in the areas of the long channel device 20 and the short channel device 18 (as measured from the surface of the substrate 12).

Figure 4A:
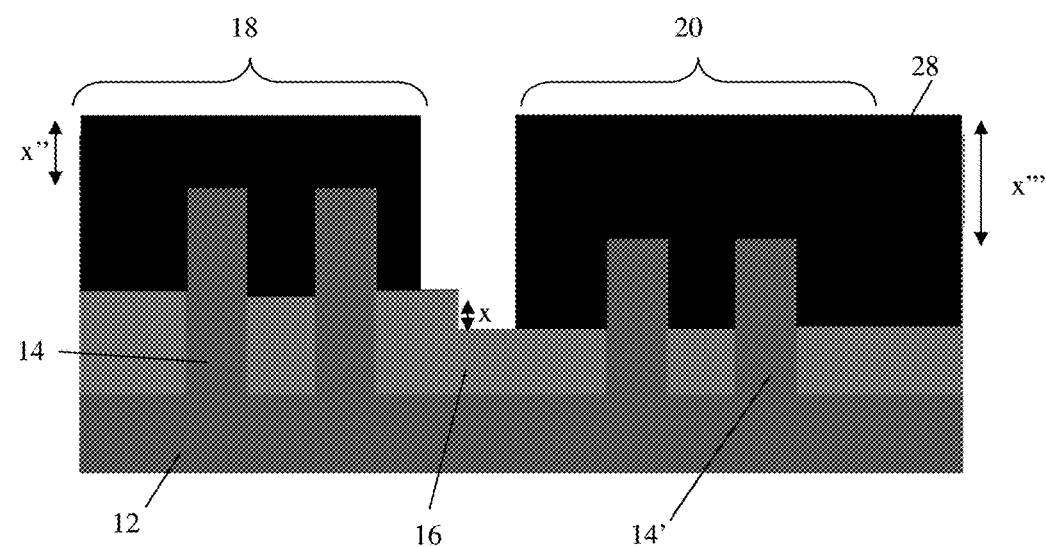
FIGS. 4A and 4B show different views of dummy gate structures, amongst other features, and respective fabrication processes in accordance with aspects of the present disclosure.
Figure 4B:
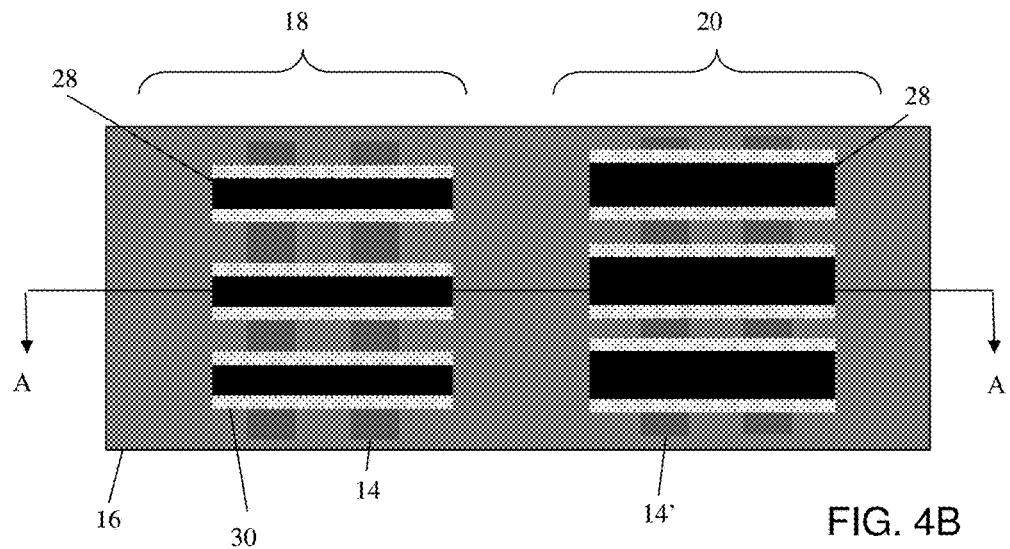

FIGS. 4A and 4B show different views of dummy gate structures, amongst other features, and respective fabrication processes in accordance with aspects of the present disclosure. More specifically, FIG. 4A shows a cross-sectional view of the structure shown in FIG. 4B along line A-A. In embodiments, a dummy gate material is deposited over the fin structures 14', 14, followed by a patterning process to form dummy gate structures 28. In embodiments, the dummy gate material can be a poly material which is subjected to conventional lithography and etching processes as should be understood by those of skill in the art. Due to the recessing of the fin structures 14' by a distance "x", the height, x", of the dummy gate structure in the area of short channel devices 18 is less than the height, x''', of the dummy gate structures in the area of the long channel devices 20 (e.g., x''=x'''−x). For example, the height x''' can be about 65 nm; whereas, the height x" can be about 59 nm.

As further shown in FIG. 4B, after the patterning process, insulator material 30 can be formed on the fin structures 14, 14' and dummy gate structures 18. In embodiments, the insulator material 30 can be any sidewall or spacer material, e.g., oxide or nitride based materials, deposited by conventional CVD processes. Following the deposition of the insulator material, an anisotropic etch and CMP process can be performed on the dummy gate structures 28, leaving the insulator material 30 on the sidewalls of the dummy gate structures 28. At this stage or others known to those of skill in the art, source and drain regions can be provided adjacent to the dummy gate structures 28, e.g., by conventional in-situ doping or ion implantation processes known to those of skill in the art.

In alternative embodiments, depending on the particular replacement gate processes, a gate dielectric material, e.g., high-k dielectric, can be deposited prior to the deposition of the dummy gate material. In embodiments, the high-k dielectric gate material can be a hafnium based dielectrics, as an example. In further embodiments, examples of such high-k dielectrics include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. In this scenario, both the gate dielectric material and the dummy gate material would be patterned together to form the dummy gate structures 28.

Figure 5A:
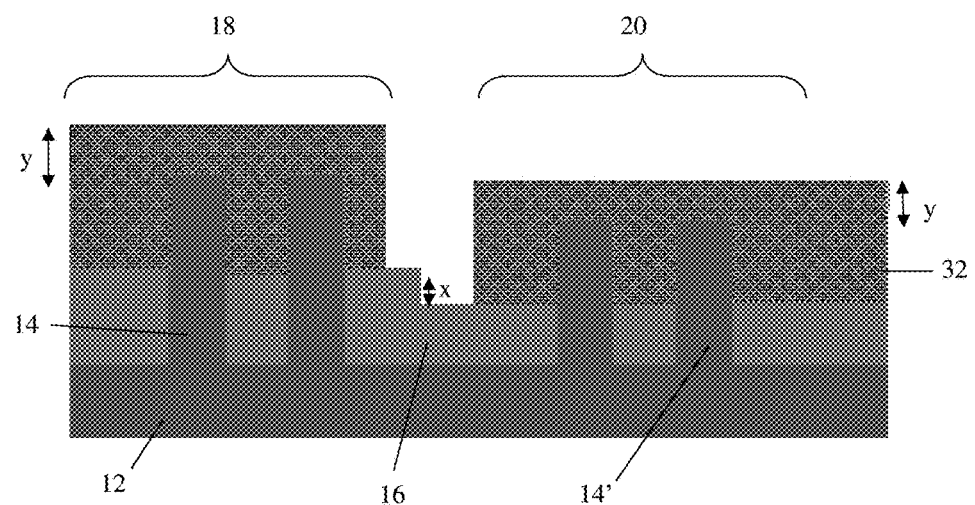
FIGS. 5A and 5B show different views of replacement gate structures, amongst other features, and respective fabrication processes in accordance with aspects of the present disclosure.
Figure 5B:
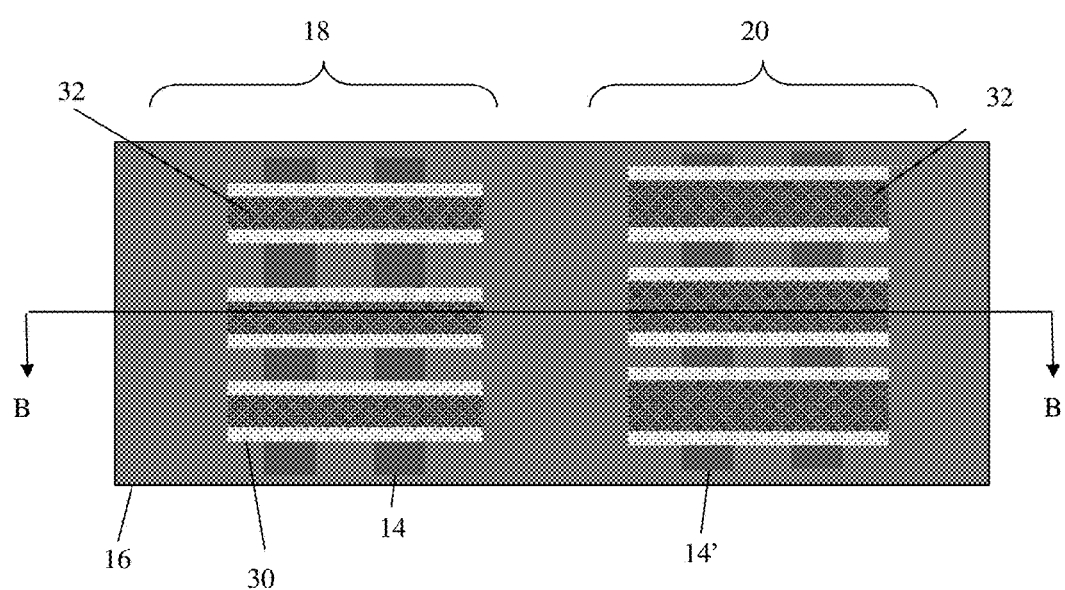

FIGS. 5A and 5B show different views of replacement gate structures, amongst other features, and respective fabrication processes in accordance with aspects of the present disclosure. More specifically, FIG. 5A shows a cross-sectional view of the structure shown in FIG. 5B along line B-B. In embodiments, the dummy gate material is removed from between the insulator material 30 using any etching processes that is selective to the dummy gate material. Following the removal of the dummy gate material, replacement gate material can 32 is then deposited using conventional deposition processes. In embodiments, the replacement gate material 32 can be any desirable gate dielectric material and work function metal or metal alloys, followed by a tungsten fill material. In embodiments, the tungsten fill material can undergo a polishing process, e.g., CMP, above fin structures 14, 14' in areas of the short channel devices 18 and areas of the long channel devices 20, respectively. The resulting structures are a plurality of long channel devices 20 and a plurality of short channel devices 18 each having a same height "y" above an upper surface of the fin structures 14, 14', respectively. In embodiments, the height "y" can be about 28 nm; although other heights are contemplated herein.

As should now be understood by those of skill in the art, due to the recessing process (e.g., insertion of the mask prior to fin reveal), the fin structures 14' in areas of the long channel devices 20 will not be revealed during the gate CMP process. This allows a height reduction of the gate structures 32 in the areas of short channel devices 20, e.g., due to the minimum height "y" achieved above the fin structures 14, 14'. That is, uniform gate height across different gate lengths, e.g., gate structures of the short channel devices 18 and long channel devices 20, permit the reduction in gate height of the short channel devices 18 without exposing the fin structures on the long channel devices 20. In this way it is possible to improve device performance for the short channel devices, e.g., increased RO performance, without degrading device performance for the long channel devices (which would have a fin reveal issue in conventional processes, post gate CMP processes).

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    short channel devices in a first area of an integrated circuit die; and
    long channel devices in a second area of the integrated circuit die, the long channel devices having a same gate height as the short channel devices, wherein
    the short channel devices and the long channel devices are finFET devices, and
    fin structures of the finFET devices are at a same height for the short channel devices and the long channel devices as measured from a surface of an isolation region.

2. The structure of claim 1, wherein fin structures of the finFET devices for the short channel devices and the long channel devices have a different absolute fin height as measured from a surface of a substrate used to form the fin structures.

3. The structure of claim 1, wherein the long channel devices are recessed with respect to the short channel devices.

4. The structure of claim 1, wherein the short channel devices have a gate length of less than 80 nm and the long channel devices have a gate length of 80 nm or greater.

5. The structure of claim 1, wherein the gate height of the long channel devices and the short channel devices are the same, post gate polishing.

6. The structure of claim 1, wherein the gate structures of the long channel devices and the short channel devices are replacement gate structures.

7. A structure, comprising:
    short channel finFET devices in a first area of an integrated circuit die; and
    long channel finFET devices in a second area of the integrated circuit die,
    wherein gate structures of the long channel devices having a same gate height as gate structures of the short channel devices, and
    wherein fin structures of the finFET devices for the short channel devices and the long channel devices have a different absolute fin height as measured from a surface of a substrate used to form the fin structures.

8. The structure of claim 7, wherein the long channel devices are recessed with respect to the short channel devices.

9. The structure of claim 7, wherein the short channel devices have a gate length of less than 80 nm and the long channel devices have a gate length of 80 nm or greater.

10. The structure of claim 7, wherein the gate structures of the long channel devices and the short channel devices are replacement gate structures.

* * * * *